United States Patent
Howland, Jr.

(10) Patent No.: US 7,282,941 B2
(45) Date of Patent: Oct. 16, 2007

(54) METHOD OF MEASURING SEMICONDUCTOR WAFERS WITH AN OXIDE ENHANCED PROBE

(75) Inventor: William H. Howland, Jr., Wexford, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 136 days.

(21) Appl. No.: 11/099,114

(22) Filed: Apr. 5, 2005

(65) Prior Publication Data
US 2006/0219658 A1    Oct. 5, 2006

(51) Int. Cl.
*G01R 31/26* (2006.01)

(52) U.S. Cl. ............... 324/765; 324/761; 324/72.5; 324/766; 438/17

(58) Field of Classification Search ........... 324/72.5, 324/752–765, 658, 663, 671–672, 717; 438/14–17
See application file for complete search history.

(56) References Cited

U.S. PATENT DOCUMENTS

| | | | | |
|---|---|---|---|---|
| 3,449,644 | A | * | 6/1969 | Armenag ............... 257/402 |
| 5,140,272 | A | * | 8/1992 | Nishimatsu et al. ....... 324/662 |
| 5,469,072 | A | * | 11/1995 | Williams et al. ............ 324/754 |
| 5,500,607 | A | * | 3/1996 | Verkuil ..................... 324/761 |
| 5,907,764 | A | * | 5/1999 | Lowell et al. ............... 438/17 |
| 6,181,144 | B1 | * | 1/2001 | Hembree et al. ........... 324/754 |
| 6,492,827 | B1 | * | 12/2002 | Mazur et al. ............... 324/761 |
| 6,613,677 | B1 | * | 9/2003 | Herbots et al. ............. 438/694 |
| 6,632,691 | B1 | * | 10/2003 | Howland ..................... 438/17 |
| 7,023,231 | B2 | * | 4/2006 | Howland et al. ........... 324/765 |

* cited by examiner

*Primary Examiner*—Ha Tran Nguyen
*Assistant Examiner*—Arleen M. Vazquez
(74) *Attorney, Agent, or Firm*—The Webb Law Firm

(57) ABSTRACT

A method of measuring at least one electrical property of a semiconductor wafer includes providing an elastically deformable and electrically conductive contact having an insulative oxide layer formed on an exterior surface thereof by a controlled oxidation process, such as, without limitation, thermal oxidation, anodic oxidation or deposition oxidation. A first electrical contact is formed between the oxide layer on the surface of the contact and a dielectric layer overlaying a top surface of the semiconductor wafer and a second electrical contact is formed with the semiconductor wafer. A CV type stimulus is applied between the first electrical contact and the second electrical contact. A response of the semiconductor wafer to the CV type stimulus is measured and at least one electrical property of the dielectric layer, the semiconductor wafer or both is determined from the response.

14 Claims, 2 Drawing Sheets

METHOD OF MEASURING SEMICONDUCTOR WAFERS WITH AN OXIDE ENHANCED PROBE

BACKGROUND OF THE INVENTION

1. Field of the Invention

The present invention relates to the testing of semiconductor wafers.

2. Description of Related Art

The use of conductive elastic probes for measuring one or more electrical properties of a semiconductor wafer is disclosed in U.S. Pat. No. 6,492,827 to Mazur et al. It has been observed that conductive elastic probes formed from certain materials, such as platinum, iridium or tantalum, or probes having at least platinum, iridium or tantalum-coated tips work best for testing semiconductor wafers. Heretofore, it was believed that the inability to grow oxides and/or the ability to grow conductive oxides on one or more of these materials rendered them more useful for such testing. However, when using such probes to perform CV type measurements of semiconductor wafers having overlaying ultra-thin dielectric layers, an undesirable leakage current flows thorough the dielectric layers thereby adversely affecting the measurement.

What is, therefore, needed and not disclosed in the prior art is a method of measuring the response of a semiconductor wafer to a CV type stimulus applied by a contact or probe to the semiconductor wafer via an overlaying ultra-thin dielectric layer of the semiconductor wafer without causing leakage current to flow through the dielectric layer.

SUMMARY OF THE INVENTION

The invention is a method of measuring at least one electrical property of a semiconductor wafer. The method includes providing an elastically deformable and electrically conductive contact having an insulative oxide layer formed on an exterior surface thereof by a controlled oxidation process, such as thermal oxidation, anodic oxidation or deposition oxidation, and forming a first electrical contact between the oxide layer on the surface of the contact and a dielectric layer overlaying a top surface of the semiconductor wafer. A second electrical contact is formed with the semiconductor wafer and a CV type stimulus is applied to the dielectric layer and the semiconductor wafer by way of the first electrical contact and the second electrical contact. A response of the semiconductor wafer to the CV type stimulus is measured and at least one electrical property of the dielectric layer, the semiconductor wafer or both is determined from the measured response.

The oxide layer is formed on the exterior surface of the contact desirably after removal of any native oxide layer from said exterior surface by any suitable means.

The conductive contact can be a tip of a probe. The conductive contact can include an electrically conductive coating overlaying an electrically conductive base material. The electrically conductive coating can define the exterior surface upon which the dielectric layer is formed.

The base material can have a first work function and the coating can have a second work function. The coating can have a thickness whereupon an overall work function of the conductive contact is either (i) intermediate the first work function and the second work function or (ii) equal to the second work function.

The base material can be comprised of tantalum. The coating can be comprised of iridium.

The base material can have a first work function and the coating can have a second work function. The coating can include a layer of a first material overlaying the base material and a layer of a second material overlaying the first material. The second work function can be related to work functions of the first and second materials, e.g., the second work function can be intermediate the work function of the first material and the work function of the second material.

The base material, the first material and the second material can be different metals. The base material can be tantalum (Ta). The first material can be iridium (Ir) and the second material can be at least one of ruthenium (Ru) and tantalum (Ta).

DETAILED DESCRIPTION OF THE INVENTION

The present invention will be described with reference to the accompanying figures, where like reference numbers correspond to like elements.

Figure 1:
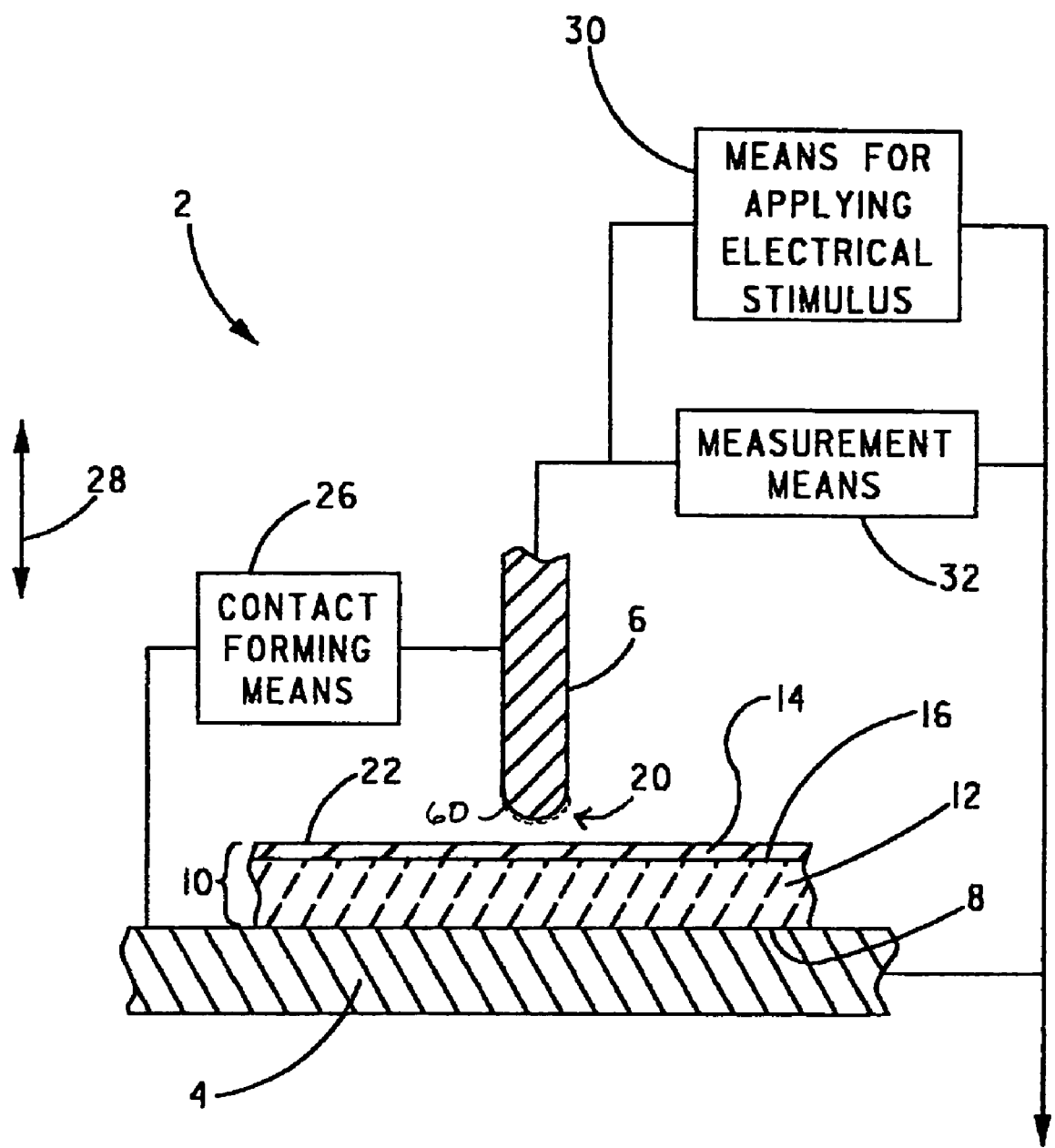
FIG. 1 is a cross-sectional view of a semiconductor wafer having a block diagram of a semiconductor wafer test system including a first embodiment contact in operative relation thereto.

With reference to FIG. 1, a semiconductor wafer test system 2 includes an electrically conductive vacuum chuck 4 and a first embodiment of an electrically conductive contact 6. The illustration of contact 6 in FIG. 1 in the form of an elongated probe is not to be construed as limiting the invention since it is envisioned that contact 6 can have any shape or form suitable for testing a semiconductor wafer 10.

Chuck 4 is configured to support a backside 8 of semiconductor wafer 10 which includes a substrate 12 formed of semiconducting material which is held in contact with chuck 4 by means of a vacuum (not shown). Semiconductor wafer 10 can, but does not necessarily, include a dielectric layer 14 overlaying a topside 16 of substrate 12.

Desirably, contact 6 includes at least a partially spherical and conductive surface 20 for contacting topside 16 of substrate 12 or a topside 22 of dielectric layer 14 when present. While a partially spherical conductive surface 20 is desired, it is envisioned that surfaces (not shown) having other shapes suitable for testing a semiconductor wafer 10 can be utilized. Accordingly, the illustration in FIG. 1 of conductive surface 20 being partially spherical is not to be construed as limiting the invention.

Desirably, the first embodiment of contact 6 can either be formed entirely from platinum, iridium or tantalum, or can include a body formed from a suitable electrically conductive material having a coating of platinum or tantalum at least on the tip thereof.

A contact forming means 26, of the type well known in the art, controls the vertical movement of chuck 4 and/or contact 6, in the directions shown by arrow 28, to move contact 6 and semiconductor wafer 10 toward each other whereupon contact 6 and, more particularly, conductive surface 20 presses into contact with topside 16 of substrate 12 or topside 22 of dielectric layer 14 if present.

A means for applying electrical stimulus 30 can be electrically connected to apply a suitable electrical stimulus to contact 6 and semiconductor wafer 10 when it is received on chuck 4 and conductive surface 20 of contact 6 is in contact with topside 16 of substrate 12 or topside 22 of dielectric layer 14 if present.

A measurement means 32 can be electrically connected for measuring the response of semiconductor wafer 10 to the test stimulus applied by the means for applying electrical stimulus 30. Chuck 4 can be connected to a reference ground or to an AC and/or DC reference bias.

Figure 2:
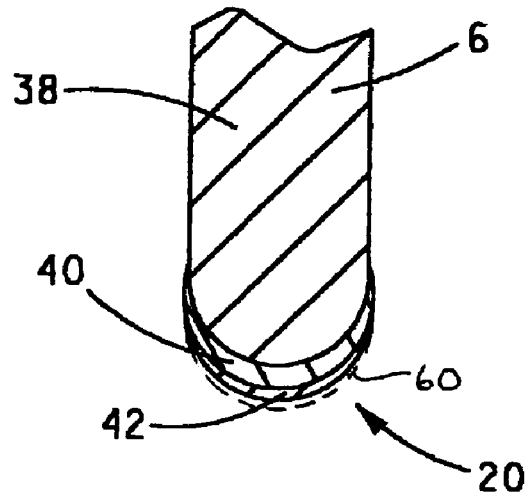
FIGS. 2-5 are different embodiment contacts that can be used with the test system shown in FIG. 1.

With reference to FIG. 2, and with continuing reference to FIG. 1, a second embodiment of contact 6 includes a body 38 formed of a suitable electrically conductive material having an electrically conductive layer or coating 42, formed from iridium or an iridium alloy, overlaying a layer or coating of an electrically conductive base material 40, such as tantalum or a tantalum alloy, in contact with body 38.

Figure 3:
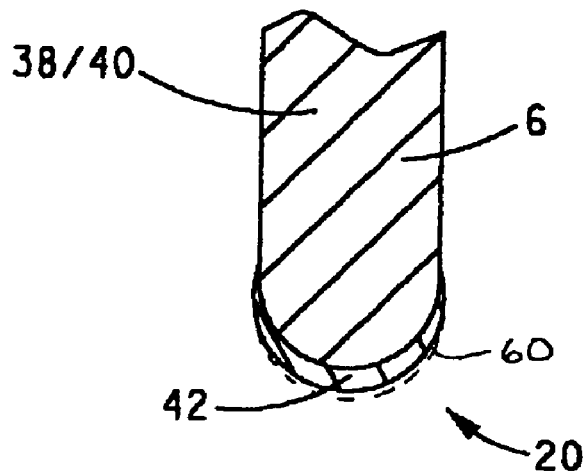

With reference to FIG. 3, and with continuing reference to FIGS. 1 and 2, a third embodiment of contact 6 includes electrically conductive coating 42 overlaying electrically conductive base material 40 which, in this embodiment, forms body 38 of contact 6. This is in contrast to the variation of the first embodiment of contact 6 that includes a body formed from a suitable electrically conductive material having a coating of platinum or tantalum thereon.

Figure 4:
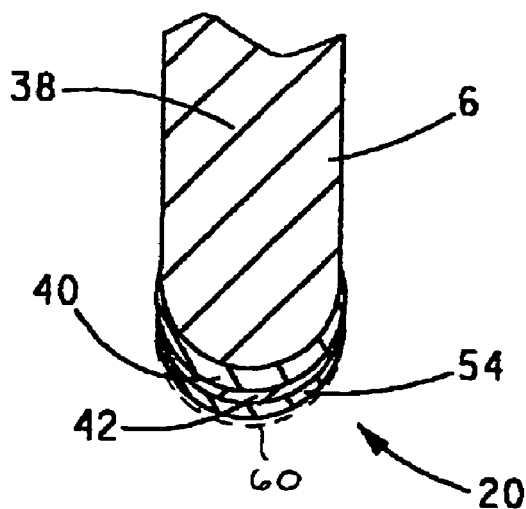

With reference to FIG. 4, and with continuing reference to FIGS. 1-3, a fourth embodiment of contact 6 includes body 38 having coating 42 overlaying the coating of base material 40 in contact with body 38 in a manner similar to the second embodiment of contact 6 shown in FIG. 2. However, in the fourth embodiment of contact 6 shown in FIG. 4, a layer or coating 54, formed from ruthenium (Ru), tantalum (Ta) or a Ru-Ta alloy, overlays coating 42.

Figure 5:
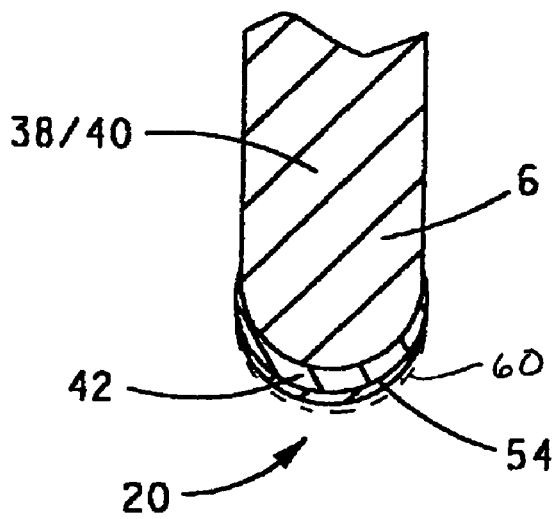

With reference to FIG. 5, and with continuing reference to FIGS. 1-4, a fifth embodiment of contact 6 includes body 38 formed from a base material 40 like the third embodiment of contact 6 shown in FIG. 3. In the fifth embodiment of contact 6 shown in FIG. 5, however, coating 54 overlays coating 42.

As shown in FIGS. 2-5, it is only necessary that layers or coatings 42 and/or 54 define surface 20 of contact 6 which contact forming means 26 presses into contact with topside 16 of substrate 12 or topside 22 of dielectric layer 14 if provided. However, this is not to be construed as limiting the invention.

As shown in FIG. 2, coating 42 is desirably in electrical contact with body 38 only via base material 40. In other words, coating 42 is desirably not in direct electrical contact with body 38. In FIG. 3, coating 42 is directly in contact with body 38 formed from base material 40. In FIG. 4, coating 42 is desirably in contact with body 38 only via base material 40, and coating 54 is desirably in contact with body 38 only via coating 42 and base material 40. In other words, there is no direct electrical contact between coating 42 and body 38, or between coating 54 and base material 40 or body 38. In FIG. 5, coating 54 is desirably in contact with body 38 only via coating 42. In other words, coating 54 is not in direct electrical contact with body 38 formed from base material 40.

In the embodiments of contact 6 shown in FIGS. 2 and 3, coating 42 has a thickness whereupon surface 20 of each embodiment contact 6 has an overall work function equal to the work function of the material forming coating 42. Alternatively, in the embodiments of contact 6 shown in FIGS. 2 and 3, coating 42 can have a thickness whereupon surface 20 of each embodiment contact 6 has an overall work function that is intermediate the work functions of the materials forming coating 42 and base material 40. In order to achieve this intermediate work function, coating 42 must be thick enough to impart the work function of its material to the overall work function, but thin enough to avoid its work function from masking the work function of base material 40. In one non-limiting example, coating 42 has a thickness of no more than five (5) Debye lengths. However, this is not to be construed as limiting the invention.

In the embodiments of contact 6 shown in FIGS. 4 and 5, coating 54 desirably has a thickness whereupon surface 20 has an overall work function that is either equal to the work function of the material forming coating 54 or a work function intermediate the work functions of coatings 42 and 54. This intermediate work function can be achieved by controlling the thickness of coating 54 in the manner described above for coating 42 overlaying base material 40.

Desirably, the work function of surface 20 of each of the embodiments of contact 6 shown in FIGS. 2-5 is between 3.0 eV and 6.0 eV for testing semiconductor wafers. However, this is not to be construed as limiting the invention since the overall work function of surface 20 can be set as desired to optimize the testing of semiconductor wafers.

In the use of any of the embodiments of contact 6 shown in FIGS. 1-5, contact forming means 26 causes surface 20 of contact 6 to press into contact with either topside surface 16 of substrate 12 or topside 22 of dielectric layer 14 if provided, thereby forming a first electrical contact. The backside 8 of semiconductor wafer 10 in contact with chuck 4 defines a second electrical contact. Alternatively, the second electrical contact can be formed directly with substrate 12 or via another contact (not shown) in contact with topside surface 16 of substrate 12 or topside 22 of dielectric layer 14 if provided.

Once the first and second electrical contacts have been formed, the means for applying the electrical stimulus 30 applies a suitable electrical stimulus between the first electrical contact and the second electrical contact. During application of this electrical stimulus, measurement means 32 measures a response of the semiconductor wafer 10 to the electrical stimulus. Based on this response, measurement means 32 can determine at least one electrical property of dielectric layer 14, substrate 12, an interface of dielectric layer 14 and substrate 12, or some combination thereof.

Non-limiting examples of suitable electrical stimuli that can be applied by the means for applying electrical stimulus 30 that measurement means 32 can measure include a capacitance-voltage type stimulus (CV), a conductance-voltage (GV) type stimulus, a charge-voltage (QV) type stimulus, and/or a current-voltage (IV) type stimulus. Non-limiting examples of electrical properties that can be determined from these stimuli include flat-band voltage ($V_{FB}$), threshold voltage ($V_T$) and leakage current ($I_{LEAK}$). Since details regarding the application of these electrical stimuli and the determination of at least one electrical property of dielectric layer 14, substrate 12, an interface of dielectric layer 14 and substrate 12, or some combination thereof, from these electrical stimuli are well known in the art, details regarding the application of these electrical stimuli and the determination of said at least one electrical property will not be described herein for purpose of simplicity.

It has been observed that when an embodiment of contact 6 having a surface 20 that is formed of a material other than tantalum is used for testing a semiconductor wafer 10 including today's ultra-thin dielectric layer 14 (on the order of 15-18 Angstroms) with a CV type stimulus, an undesirable leakage current flows in contact 6 via surface 20 in contact with dielectric layer 14 thereby adversely affecting the measurement of the response of the semiconductor wafer 10 to the CV type stimulus and the resulting determination of at least one electrical property of the semiconductor wafer. This leakage current is caused by so-called "quantum mechanical tunneling" through dielectric layer 14 as a result of the thickness of dielectric layer 14 dropping below a thickness where this quantum mechanical tunneling begins (on the order of 25-30 Angstroms). Contacts 6 having surfaces 20 formed of tantalum typically do not exhibit quantum mechanical tunneling.

It has been observed that the combination of any insulative native oxide growth on surface 20 formed of a material other than tantalum (due to the exposure to atmospheric air) in contact with dielectric layer 14 during testing is insufficient to eliminate quantum mechanical tunneling or reduce quantum mechanical tunneling to a desired extent. It is believed this is because: (1) such native oxide does not grow to a sufficient thickness such that the combined thicknesses of the native oxide and dielectric layer 14 during testing utilizing a CV type stimulus eliminates quantum mechanical tunneling or reduces quantum mechanical tunneling to a desired extent; (2) the native oxide is of poor quality whereupon it is full of electron and hole traps that facilitate current flow therethrough; or (3) both. Obviously, if surface 20 is formed of a material that is unable to grow an insulative native oxide (such a iridium) or is formed of a material that grows a conductive oxide, said surface 20 will likewise not contribute to the elimination of quantum mechanical tunneling or a reduction of quantum mechanical tunneling to a desired extent.

In order to eliminate quantum mechanical tunneling or reduce quantum mechanical tunneling during testing utilizing a CV type stimulus, an insulative oxide layer 60 (shown in phantom in FIGS. 1-5) having few or no electron and hole traps can be intentionally formed on surface 20 by a controlled oxidation process. Because a surface 20 formed of tantalum typically forms a suitable quality and thickness of native oxide thereon to avoid quantum mechanical tunneling, it is typically not necessary to intentionally form oxide layer 60 on said surface 20. However, this is not to be construed as limiting the invention since it is envisioned that oxide layer 60 can be intentionally formed on a surface 20 formed of tantalum if desired or necessary to optimize the performance thereof.

Oxide layer 60 can be formed by the controlled oxidation growth process of either thermal oxidation, anodic oxidation or deposition oxidation. Since these oxidation processes are well known in the art, details regarding these oxidation processes are not described herein for purpose of simplicity. Desirably, oxide layer 60 is formed after removal of any native oxide layer on surface 20. However, this is not to be construed as limiting the invention.

Each of the foregoing controlled oxidation processes can control the thickness to which oxide layer 60 is formed on surface 20. Accordingly, by way of any of the foregoing controlled oxidation processes, the thickness to which oxide layer 60 is formed can be set as desired whereupon quantum mechanical tunneling is eliminated or reduced to a desired extent while, at the same time, the operation of the contact 6 for CV type testing of semiconductor wafer 10 is unaffected. Stated differently, it is desirable that the sum of the thickness of dielectric layer 14 and oxide layer 60 be such that quantum mechanical tunneling is eliminated or reduced to a desired extent while, at the same time, measurement means 32 can calibrate out the effect(s) of oxide layer 60 on the measurement of the response of the semiconductor wafer 10 to the CV type stimulus. To this end, the sum of the thickness of dielectric layer 14 and oxide layer 60 when surface 20 is in contact with dielectric layer 14 is desirably between about 25 and 1000 Angstroms, inclusive, more desirably between about 25 and 500 Angstroms, inclusive, and even more desirably between about 25 and 30 Angstroms, inclusive.

The present invention has been described with reference to the preferred embodiments. Obvious modifications and alterations will occur to others upon reading and understanding the preceding detailed description. For example, each of the embodiments of contact 6 is illustrated as a probe having a tip defining surface 20. However, this is not to be construed as limiting the invention. Moreover, the illustration of the various layers 40, 42, 54 and 60 extending outside the radius of body 38 is shown for illustration purposes only. As would be appreciated by one skilled in the art, however, coatings 40, 42, 54 and 60 are relatively thin whereupon these layers would not extend outside the radius of body 38 to the extent shown in the figures. It is intended that the invention be construed as including all such modifications and alterations insofar as they come within the scope of the appended claims or the equivalents thereof.

The invention claimed is:

1. A method of measuring at least one electrical property of a semiconductor wafer comprising:
   (a) providing an elastically deformable and electrically conductive contact having an insulative oxide layer formed on an exterior surface thereof by a controlled oxidation process;
   (b) forming a first electrical contact between the oxide layer on the surface of the contact and a dielectric layer overlaying a top surface of the semiconductor wafer whereupon no part of the electrically conducting portion of the contact touches the dielectric layer;
   (c) forming a second electrical contact with the semiconductor wafer;
   (d) applying a CV type stimulus between the first electrical contact and the second electrical contact;
   (e) measuring a response of the semiconductor wafer to the CV type stimulus; and
   (f) determining from the response at least one electrical property of the dielectric layer, the semiconductor wafer or both.

2. The method of claim 1, wherein the controlled oxidation process is one of thermal oxidation, anodic oxidation and deposition oxidation.

3. The method of claim 1, wherein the oxide layer is formed on the exterior surface of the contact after removal of a native oxide layer from said exterior surface.

4. The method of claim 1, wherein the conductive contact is a tip of a probe.

5. The method of claim 1, wherein:
   the conductive contact includes an electrically conductive coating overlaying an electrically conductive base material; and
   the electrically conductive coating defines the exterior surface having the dielectric layer formed thereon.

6. The method of claim 5, wherein:
   the base material has a first work function and the coating has a second work function; and
   the coating has a thickness whereupon an overall work function of the conductive contact is either (i) intermediate the first work function and the second work function or (ii) equal to the second work function.

7. The method of claim 5, wherein the thickness of the coating is no more than five (5) Debye lengths.

8. The method of claim 5, wherein the base material is comprised of tantalum.

9. The method of claim 5, wherein the coating is comprised of iridium.

10. The method of claim 5, wherein:
the base material has a first work function and the coating has a second work function;
the coating includes a layer of first material overlaying the base material and a layer of a second material overlaying the first material; and
the second work function is related to work functions of the first and second materials.

11. The method of claim 10, wherein the second work function is intermediate the work function of the first material and the work function of the second material.

12. The method of claim 10, wherein the base material, the first material and the second material are different metals.

13. The method of claim 10, wherein the base material is comprised of tantalum.

14. The method of claim 10, wherein:
the first material is comprised of iridium; and
the second material is comprised of at least one of ruthenium (Ru) and tantalum (Ta).

* * * * *